(12) United States Patent
Wang et al.

(10) Patent No.: US 12,550,662 B2
(45) Date of Patent: Feb. 10, 2026

(54) INTEGRATED PROCESS FLOWS FOR HYBRID BONDING

(71) Applicant: Applied Materials, Inc., Santa Clara, CA (US)

(72) Inventors: Ruiping Wang, San Jose, CA (US); Ying Wang, Singapore (SG); Raymond Hung, Palo Alto, CA (US); Guan Huei See, Singapore (SG)

(73) Assignee: Applied Materials Inc., Santa Clara, CA (US)

( * ) Notice: Subject to any disclaimer, the term of this patent is extended or adjusted under 35 U.S.C. 154(b) by 588 days.

(21) Appl. No.: 17/989,826

(22) Filed: Nov. 18, 2022

(65) Prior Publication Data

US 2024/0170443 A1    May 23, 2024

(51) Int. Cl.
| | | |
|---|---|---|
| H01L 21/00 | (2006.01) | |
| H01L 21/67 | (2006.01) | |
| H01L 23/00 | (2006.01) | |

(52) U.S. Cl.
CPC ........ H01L 24/80 (2013.01); H01L 21/67132 (2013.01); H01L 21/67173 (2013.01); *H01L 2224/80011* (2013.01); *H01L 2224/80013* (2013.01); *H01L 2224/80019* (2013.01);
(Continued)

(58) Field of Classification Search
CPC ............... H01L 24/80; H01L 21/67132; H01L 21/67173; H01L 2224/80011; H01L 2224/80013; H01L 2224/80019; H01L 2224/80895; H01L 2224/80896; H01L 24/75; H01L 21/67121; H01L 21/67248; H01L 21/68771; H01L 21/68778; H01L 24/08; H01L 21/67092; H01L 21/67017; H01L 21/67207; H01L 21/67253; H01L 21/67356; H01L 21/67363; H01L 21/67389; H01L 21/67769; H01L 2224/08245; H01L 2224/80908;
(Continued)

(56) References Cited

U.S. PATENT DOCUMENTS

| | | |
|---|---|---|
| 10,354,972 B2 | 7/2019 | Liu et al. |
| 10,748,851 B1 | 8/2020 | Wang et al. |
| 11,264,345 B2 | 3/2022 | Enquist |

(Continued)

OTHER PUBLICATIONS

International Search Report for PCT/US2023/037058, dated Mar. 8, 2024.

*Primary Examiner* — Niki H Nguyen
(74) *Attorney, Agent, or Firm* — Moser Taboada (57) ABSTRACT

A process flow for bonding a die to a substrate incorporates defectivity risk management and yield promotion by reducing flow complexity. In some embodiments, the process flow may include a radiation process on a component substrate to weaken an adhesive bonding of dies from a surface of the component substrate, a first wet clean process on the component substrate after the radiation process to clean die bonding surfaces, eject and pick processes after performing the first wet clean process to remove dies from the component substrate for bonding to a substrate, a plasma activation process on the substrate, a second wet clean process after the plasma activation process on the substrate to clean a substrate bonding surface of the substrate, and a hybrid bonding process to bond die bonding surfaces of the dies to the substrate bonding surface of the substrate.

20 Claims, 5 Drawing Sheets

(52) U.S. Cl.
CPC .............. *H01L 2224/80895* (2013.01); *H01L 2224/80896* (2013.01)

(58) Field of Classification Search
CPC ... H01L 2924/37001; H01L 2924/3701; H01L 22/12; H01L 24/05
See application file for complete search history.

(56) References Cited

U.S. PATENT DOCUMENTS

| | | |
|---|---|---|
| 11,309,278 B2 | 4/2022 | Lianto et al. |
| 2018/0308819 A1* | 10/2018 | Uzoh ...................... H01L 23/48 |
| 2019/0237357 A1 | 8/2019 | Dang |
| 2020/0321307 A1* | 10/2020 | Uzoh .................... H01L 25/065 |
| 2021/0134782 A1 | 5/2021 | Wimplinger |
| 2021/0296282 A1 | 9/2021 | Gao et al. |
| 2022/0262652 A1 | 8/2022 | Harris et al. |
| 2022/0262653 A1 | 8/2022 | Harris et al. |
| 2022/0367232 A1 | 11/2022 | Lu |

\* cited by examiner

INTEGRATED PROCESS FLOWS FOR HYBRID BONDING

FIELD

Embodiments of the present principles generally relate to semiconductor processing of semiconductor substrates.

BACKGROUND

Dies are attached to substrates using a bonding process. When the dies have surface features comprising metal materials that are to connect with other metal materials on the substrate, the process is known as hybrid bonding due to the bonding of more than one type of material. To increase the bond or attraction of the dielectric materials between the dies and substrates, the dies and substrates are put through complex preparation processes prior to the bonding process. The complexity of the preparation process flow increases maintenance due to increased number of process chambers required in addition to increasing the time for preparation which directly impacts the bonding yield. In some cases, the processing may also increase defectivity risk by exposing the substrates to additional environments in which particulates may be deposited on the substrates.

Accordingly, the inventors have provided improved hybrid bonding process flows that reduce defectivity risk and increase bonding throughput while decreasing bonding costs.

SUMMARY

Methods for improving hybrid bonding process flows are provided herein.

In some embodiments, a method for bonding a die to a substrate may comprise performing a radiation process on a component substrate with a plurality of dies to weaken an adhesive bonding of the plurality of dies from a surface of the component substrate, performing a first wet clean process on the component substrate after the radiation process to clean at least one die bonding surface, performing eject and pick processes after performing the first wet clean process to remove at least one of the plurality of dies from the component substrate for bonding to a substrate, performing a plasma activation process on the substrate, performing a second wet clean process after the plasma activation process on the substrate to clean a substrate bonding surface of the substrate, and performing a hybrid bonding process to bond the at least one die bonding surface of the at least one of the plurality of dies to the substrate bonding surface of the substrate.

In some embodiments, a hybrid bonding tool for bonding dies to substrates may comprise at least one radiation chamber, at least one wet clean chamber, at least one plasma activation chamber, at least one hybrid bonding chamber, and a controller of the hybrid bonding tool configured to bond dies to substrates by causing a performance of a radiation process in the at least one radiation chamber on a component substrate with a plurality of dies to weaken an adhesive bonding of the plurality of dies from a surface of the component substrate, a first wet clean process in the at least one wet clean chamber on the component substrate after the radiation process to clean at least one die bonding surface, eject and pick processes in the at least one hybrid bonding chamber after performing the first wet clean process to remove at least one of the plurality of dies from the component substrate for bonding to a substrate, a plasma activation process in the at least one plasma activation chamber on the substrate, a second wet clean process in the at least one wet clean chamber after the plasma activation process on the substrate to clean a substrate bonding surface of the substrate, and a hybrid bonding process in the at least one hybrid bonding chamber to bond the at least one die bonding surface of the at least one of the plurality of dies to the substrate bonding surface of the substrate.

In some embodiments, a non-transitory, computer readable medium having instructions stored thereon that, when executed, cause a method for bonding a die to a wafer to be performed, the method may comprise performing a radiation process on a component substrate with a plurality of dies to weaken an adhesive bonding of the plurality of dies from a surface of the component substrate, performing a first wet clean process on the component substrate after the radiation process to clean at least one die bonding surface, performing eject and pick processes after performing the first wet clean process to remove at least one of the plurality of dies from the component substrate for bonding to a substrate, performing a plasma activation process on the substrate, performing a second wet clean process after the plasma activation process on the substrate to clean a substrate bonding surface of the substrate, and performing a hybrid bonding process to bond the at least one die bonding surface of the at least one of the plurality of dies to the substrate bonding surface of the substrate.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods provide an overall performance improvement in hybrid bonding process flows by reducing defectivity risk and increasing bonding throughput. The methods are optimized for integrated hybrid bonding tools with onboard auxiliary process chambers. Typical approaches to improve bonding are focused on material selections, process chamber designs, and/or chamber processing conditions, and the like. The methods of the present principles employ alternative processing flows that are optimized for better bonding performances and reduced costs based on using an integrated cluster hybrid bonding tool for overall process control of the bonding process.

Figure 1:
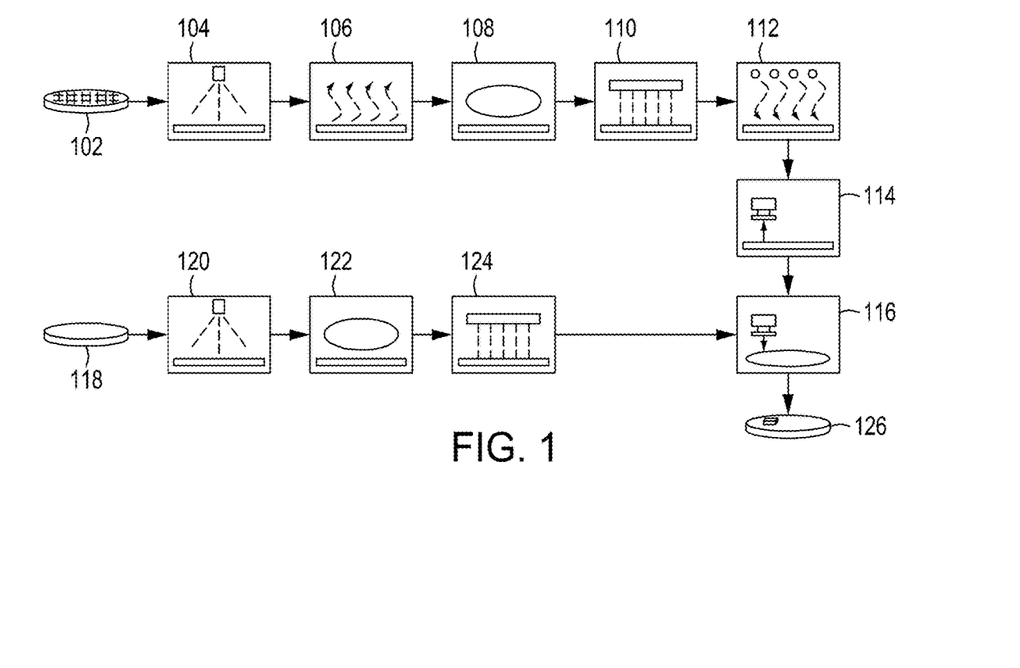
FIG. 1 depicts a process flow for hybrid bonding in accordance with some embodiments of the present principles.

An integrated cluster hybrid bonding tool, such as the multi-chamber processing tool depicted in FIG. 9 (discussed below), provides multiple processing chambers or stations in a controlled environment. The controlled environment allows processing in individual chambers and movement of substrates between chambers without a risk of contamination by exposure to undesirable environments that might cause, for example, oxidation of materials on the substrates and/or particulate depositions on the substrates that cause damage and/or hamper performance. FIG. 1 depicts an example of a first integrated tool bonding process flow 100 for hybrid bonding. In a bonding process, both dies (component substrate) and substrates on which the dies are to be bonded to are prepared prior to bonding to enhance the bonding performance. In some cases, a component substrate 102 can be processed in parallel, prior to, or after a substrate 118 on which a die from the component substrate 102 is to be bonded.

The component substrate 102 may undergo other processes prior to the hybrid bonding processes. The other processes may include upstream processing such as patterning, chemical mechanical polishing (CMP), back grinding, dicing, and the like. In some embodiments, for example, dies may be separated (singulated) and held together on the back side by dicing tape to create the component substrate 102. In some embodiments, dies may be reconstituted (molded) on a carrier wafer to form the component substrate 102 from which dies are selected for bonding. In the first integrated tool bonding process flow 100, the component substrate 102 undergoes a first wet clean process 104 and then a degassing process 106 to aid in removing moisture from the component substrate 102. The component substrate 102 is then subjected to a first plasma activation process 108 to increase bonding attraction and then subjected to a first hydration process 110. The component substrate 102 is then subjected to a radiation process 112 (e.g., UV radiation, etc.) to loosen an adhesive bond holding the dies to the component substrate 102 prior to bonding.

Figure 8:
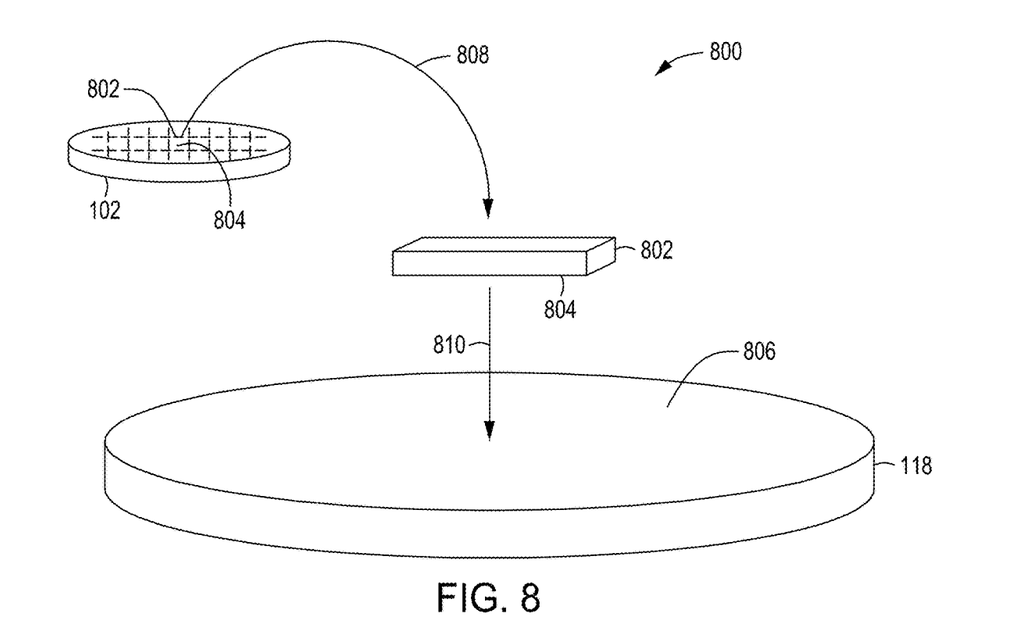
FIG. 8 depicts an isometric view of bonding surfaces for a die and a substrate in accordance with some embodiments of the present principles.

In some embodiments, the substrate 118 may undergo other processes prior to the bonding process flow. The substrate 118 may be with or without a silicon underlayer or may be a glass-supported silicon wafer depending on process flow and use cases. The substrate 118 may also have prior stacked dies on the substrate 118. The substrate 118 is processed prior to, in conjunction with, or after the processing of the component substrate 102. The substrate 118 first undergoes a second wet cleaning process 120 and is then subjected to a second plasma activation process 122. The substrate then undergoes a second hydration process 124 in preparation for bonding. Bonding is then accomplished by subjecting the component substrate 102 to an ejection and picking process 114 that allows a die to be selected and flipped in preparation for bonding. In a bonding process 116, the die is placed on the substrate 118 and the die bonds to the substrate 118 yielding a die-to-substrate (or chip-to-substrate) bonded substrate 126. The die-to-substrate bonded substrate 126 may have a plurality of dies bonded to the surface during one or multiple bonding sessions. FIG. 8 is an isometric view 800 that depicts a die 802 from the component substrate 102 being ejected/flipped and bonded to a substrate bonding surface 806 of the substrate 118. When the die 802 is attached to the component substrate 102, an uppermost surface of the die 802 is the die bonding surface 804. When the die 802 is flipped 808, the lowermost surface of the die 802 becomes the die bonding surface 804. During bonding 810, the die bonding surface 804 and the substrate bonding surface 806 are brought into contact and allowed to bond together. The bonding performance is influenced by parameters such as bonding surface contamination, bonding pressure, and/or bonding temperature, and the like.

Figure 2:
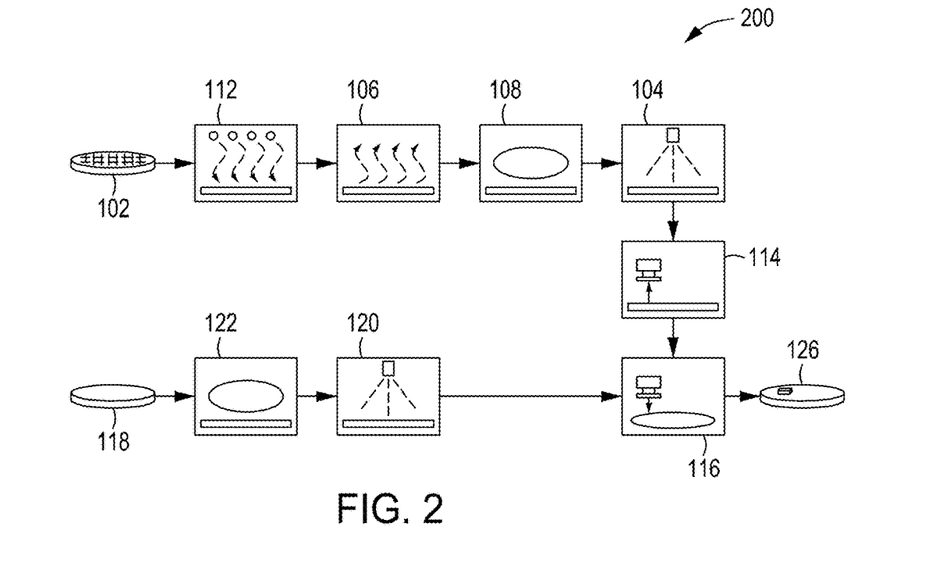
FIG. 2 depicts a process flow for hybrid bonding without hydration in accordance with some embodiments of the present principles.

The inventors observed that, although the first integrated tool bonding process flow 100 allowed for acceptable bonding between die and substrate, several of the included processes increased defectivity risks and facilitated in reducing bonding throughput. The inventors discovered that by removing at risk processes the bonding performance may be increased while also increasing bonding throughput. For example, in a second integrated tool bonding process flow 200, the component substrate 102 first undergoes the radiation process 112 before undergoing the degassing process 106. The component substrate 102 then undergoes the first plasma activation process 108 and then the first wet cleaning process 104 before being subjected to the ejection and picking process 114. The substrate 118 undergoes the second plasma activation process 122 and then the second wet cleaning process 120 in preparation for bonding. The bonding process 116 places the die from the component substrate 102 onto the substrate 118 to yield the die-to-substrate bonded substrate 126.

Figure 3:
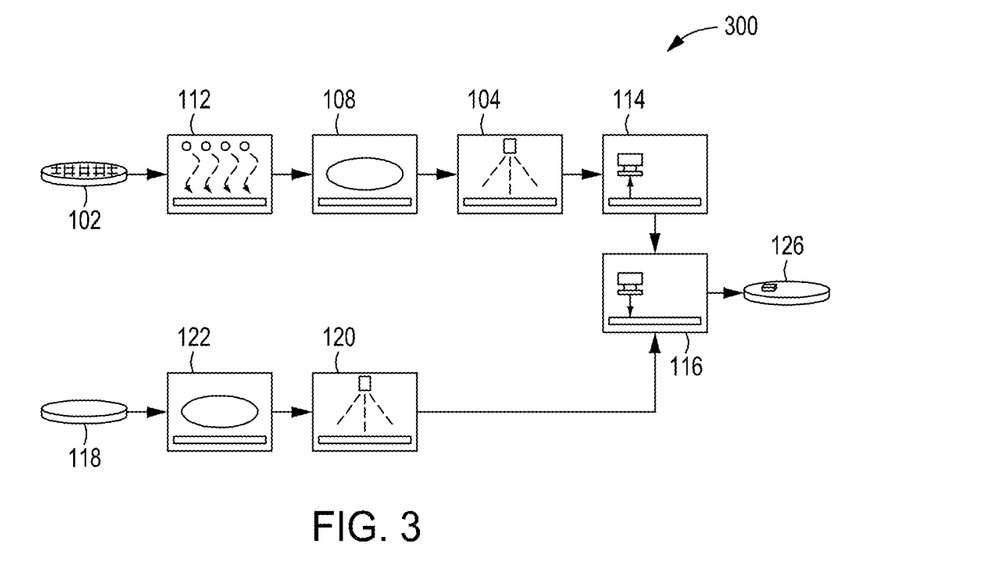
FIG. 3 depicts a process flow for hybrid bonding without component substrate degassing in accordance with some embodiments of the present principles.

The inventors further discovered that by removing additional at risk processes the bonding performance is further increased while also increasing bonding throughput even more. For example, in a third integrated tool bonding process flow 300, the component substrate 102 first undergoes the radiation process 112 before undergoing the first plasma activation process 108. The component substrate 102 then is subjected to the first wet cleaning process 104 before being subjected to the ejection and picking process 114. The substrate 118 undergoes the second plasma activation process 122 and then the second wet cleaning process 120 in preparation for bonding. The bonding process 116 places the die from the component substrate 102 onto the substrate 118 to yield the die-to-substrate bonded substrate 126.

Figure 4:
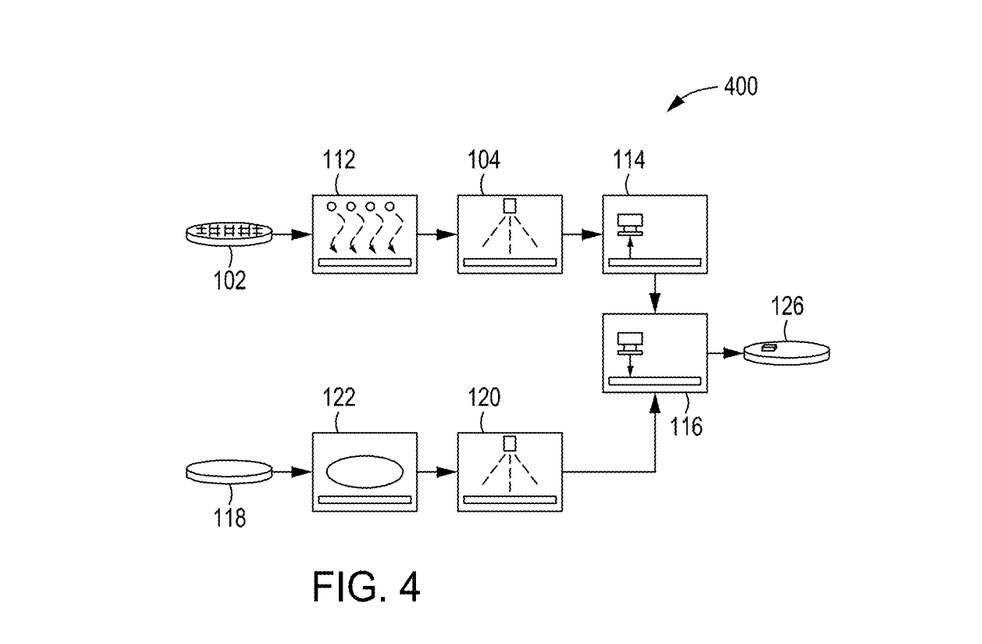
FIG. 4 depicts a process flow for hybrid bonding with substrate activation only in accordance with some embodiments of the present principles.

The inventors also discovered that by removing even more at risk processes the bonding performance is even further increased while also increasing bonding throughput to a higher level. For example, in a fourth integrated tool bonding process flow 400, the component substrate 102 first undergoes the radiation process 112 before undergoing the first wet cleaning process 104. The component substrate 102 is then subjected to the ejection and picking process 114. The substrate 118 undergoes the second plasma activation process 122 and then the second wet cleaning process 120 in preparation for bonding. The bonding process 116 places the die from the component substrate 102 onto the substrate 118 to yield the die-to-substrate bonded substrate 126.

Figure 5:
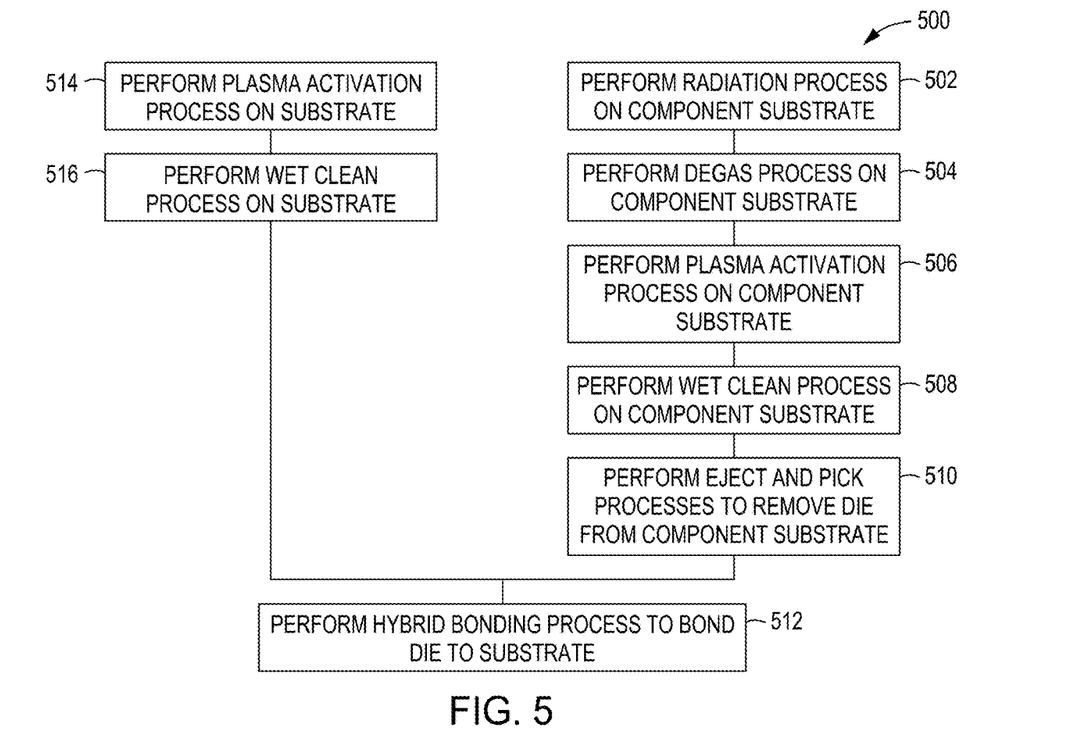
FIG. 5 is a method for hybrid bonding without hydration in accordance with some embodiments of the present principles.

FIG. 5 is a method 500 for hybrid bonding in an integrated tool without hydration in accordance with some embodiments. Method 500 is based on the second integrated tool process flow as depicted in FIG. 2. The hydration processes are eliminated for both the component substrate processing flow and the substrate processing flow. In block 502, a radiation process is performed on a component substrate. The component substrate may be a tape frame substrate or a carrier with reconstituted dies (molded dies) and the like that are used to support and transport dies for processing in an integrated bonding tool. The radiation process may be, for example but not limited to, an ultraviolet (UV) process that weakens the adhesive bond between the die and the component substrate. Although the radiation process weakens the die's bond to the component substrate to enable ejection and picking processing at a later stage, the weakened die bond is sufficient to keep the dies in place for other processing up to the ejection and picking process stage. In block 504, a degas process is performed on the component substrate. The degas process may include heating the component substrate to a sufficient temperature to allow for moisture removal and outgassing of the component substrate prior to any plasma processing. In block 506, a plasma activation process is performed on the component substrate. The plasma activation facilitates in preparing the bonding surfaces of the dies on the component substrate for bonding. In general, the plasma activation has a limited duration in which the plasma activation remains viable for bonding. In some cases, the plasma activation lasts about 7 hours to about 20 hours before re-activation is required.

In block 508, a wet cleaning process is performed on the component substrate to clean the die bonding surfaces prior to bonding. The cleaner the bonding surface, the higher the bonding strength. In block 510, ejection and picking processes are performed to select (pick) and remove (eject) a die from the component substrate for bonding. The processes may also include flipping the die (see, e.g., FIG. 8) before bonding. Prior to, after, or in conjunction with the processing of the component substrate (blocks 502-508), a substrate that a die will be bonded to undergoes processing as well. In block 514, a plasma activation process is performed on the substrate. The plasma activation facilitates in preparing the bonding surface of the substrate for bonding. In general, the plasma activation has a limited duration in which the plasma activation remains viable for bonding. In some cases, the plasma activation lasts about 7 hours to about 20 hours before re-activation is required. In block 516, a wet cleaning process is performed on the substrate to clean the substrate bonding surface prior to bonding. The cleaner the bonding surface, the higher the bonding strength. In block 512, the selected die is placed on the substrate to bond with the substrate in a hybrid bonding process. Hybrid bonding is bonding where at least two dissimilar materials are bonded together. For example, dielectric materials of a die and copper interconnects of a die are bonded to dielectric material of a substrate and copper interconnects on the substrate. In general, when the dielectric surfaces of the die and substrate come into contact, the dielectric surfaces bond together. A subsequent annealing process may then be used on the bonded die and substrate to expand the copper in the copper interconnects such that the copper interconnects of the die and the substrate flow together and bond.

Figure 6:
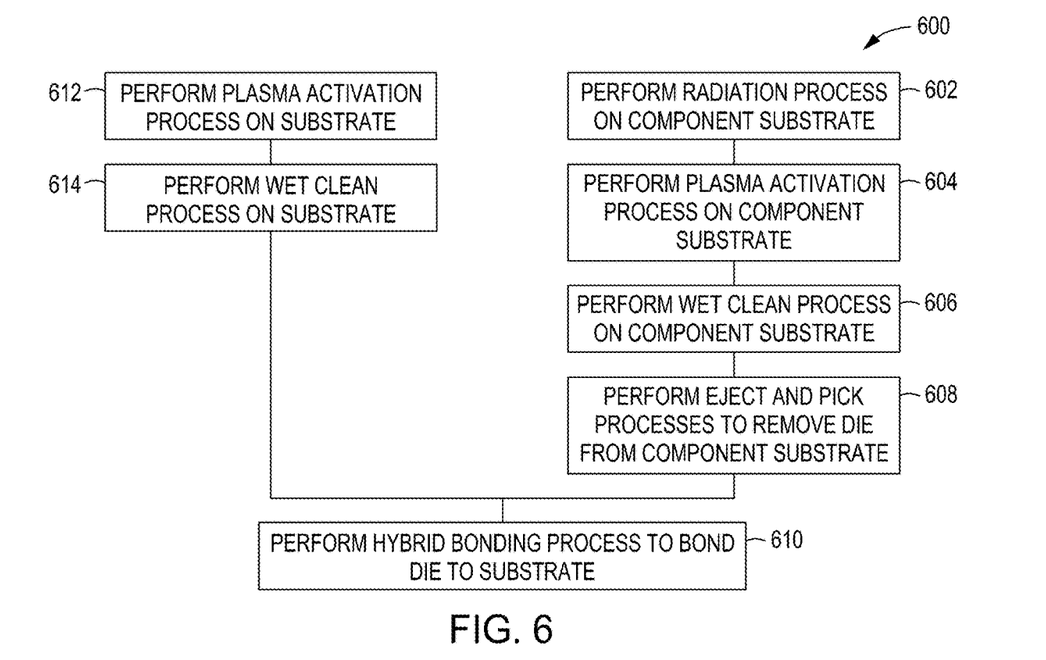
FIG. 6 is a method for hybrid bonding without component substrate degassing in accordance with some embodiments of the present principles.

FIG. 6 is a method 600 for hybrid bonding in an integrated tool without hydration or component substrate degassing in accordance with some embodiments. Method 600 is based on the third integrated tool process flow as depicted in FIG. 3. The hydration processes are eliminated for both the component substrate processing flow and the substrate processing flow along with the elimination of the degassing process for the component substrate. As wet cleaning is not performed prior to plasma processes, the degassing process to remove moisture has reduced effectiveness in a bonding flow and is removed from the flow. In block 602, a radiation process is performed on a component substrate. The component substrate may be a tape frame substrate or a carrier with reconstituted dies (molded dies) and the like that are used to support and transport dies for processing in an integrated bonding tool. The radiation process may be, for example but not limited to, an ultraviolet (UV) process that weakens the adhesive bond between the die and the component substrate. Although the radiation process weakens the die bond to the component substrate to enable ejection and picking processing at a later stage, the weakened die bond is sufficient to keep the dies in place for other processing up to the ejection and picking process stage.

In block 604, a plasma activation process is performed on the component substrate. The plasma activation facilitates in preparing the bonding surfaces of the dies on the component substrate for bonding. In general, the plasma activation has a limited duration in which the plasma activation remains viable for bonding. In some cases, the plasma activation lasts about 7 hours to about 20 hours before re-activation is required. In block 606, a wet cleaning process is performed on the component substrate to clean the die bonding surfaces prior to bonding. The cleaner the bonding surface, the higher the bonding strength. In block 608, ejection and picking processes are performed to select (pick) and remove (eject) a die from the component substrate for bonding. The processes may also include flipping the die (see, e.g., FIG. 8) before bonding. Prior to, after, or in conjunction with the processing of the component substrate (blocks 602-606), a substrate that a die will be bonded to undergoes processing as well. In block 612, a plasma activation process is performed on the substrate. The plasma activation facilitates in preparing the bonding surface of the substrate for bonding. In general, the plasma activation has a limited duration in which the plasma activation remains viable for bonding. In some cases, the plasma activation lasts about 7 hours to about 20 hours before re-activation is required. In block 614, a wet cleaning process is performed on the substrate to clean the substrate bonding surface prior to bonding. The cleaner the bonding surface, the higher the bonding strength. In block 610, the selected die is placed on the substrate to bond with the substrate in a hybrid bonding process. A subsequent annealing process may then be used on the bonded die and substrate.

Figure 7:
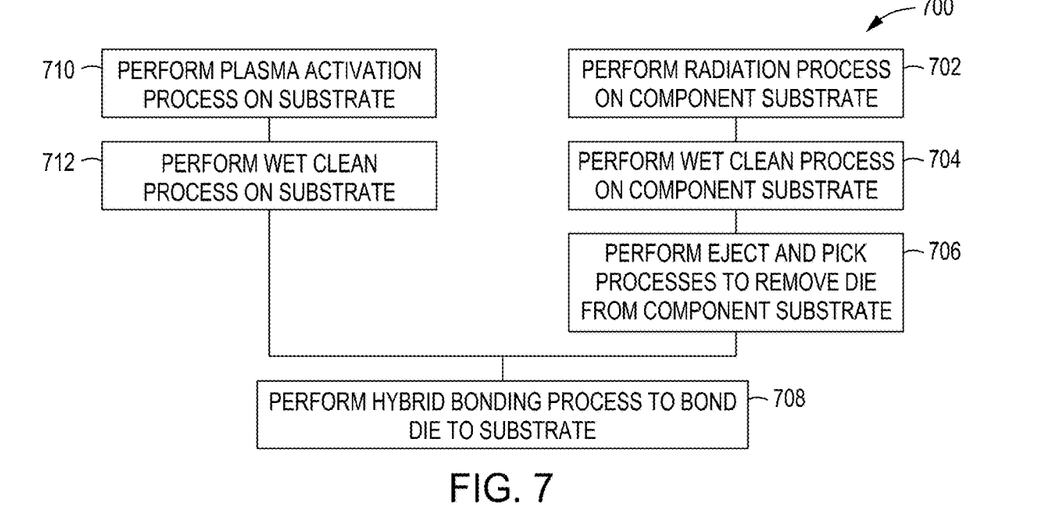
FIG. 7 is a method for hybrid bonding with substrate activation only in accordance with some embodiments of the present principles.

FIG. 7 is a method 700 for hybrid bonding in an integrated tool with substrate activation only in accordance with some embodiments. Method 700 is based on the fourth integrated tool process flow as depicted in FIG. 4. The hydration processes are eliminated for both the component substrate processing flow and the substrate processing flow along with elimination of the degassing process and plasma activation process for the component substrate. As plasma activation is not performed on the component substrate, degassing processes to remove moisture for plasma activation have significantly reduced relevance and are removed from the flow. In block 702, a radiation process is performed on a component substrate. The component substrate may be a tape frame substrate or a carrier with reconstituted dies (molded dies) and the like that are used to support and transport dies for processing in an integrated bonding tool. The radiation process may be, for example but not limited to, an ultraviolet (UV) process that weakens the adhesive bond between the die and the component substrate. Although the radiation process weakens the die bond to the component substrate to enable ejection and picking processing at a later stage, the weakened die bond is sufficient to keep the dies in place for other processing up to the ejection and picking process stage.

In block 704, a wet cleaning process is performed on the component substrate to clean the die bonding surfaces prior to bonding. The cleaner the bonding surface, the higher the bonding strength. In block 706, ejection and picking processes are performed to select (pick) and remove (eject) a die from the component substrate for bonding. The processes may also include flipping the die (see, e.g., FIG. 8) before bonding. Prior to, after, or in conjunction with the processing of the component substrate (blocks 702-704), a substrate that a die will be bonded to undergoes processing as well. In block 710, a plasma activation process is performed on the substrate. The plasma activation facilitates in preparing the bonding surface of the substrate for bonding. In general, the plasma activation has a limited duration in which the plasma activation remains viable for bonding. In some cases, the plasma activation lasts about 7 hours to about 20 hours before re-activation is required. In block 712, a wet cleaning process is performed on the substrate to clean the substrate bonding surface prior to bonding. The cleaner the bonding surface, the higher the bonding strength. In block 708, the selected die is placed on the substrate to bond with the substrate in a hybrid bonding process. A subsequent annealing process may then be used on the bonded die and substrate.

Figure 9:
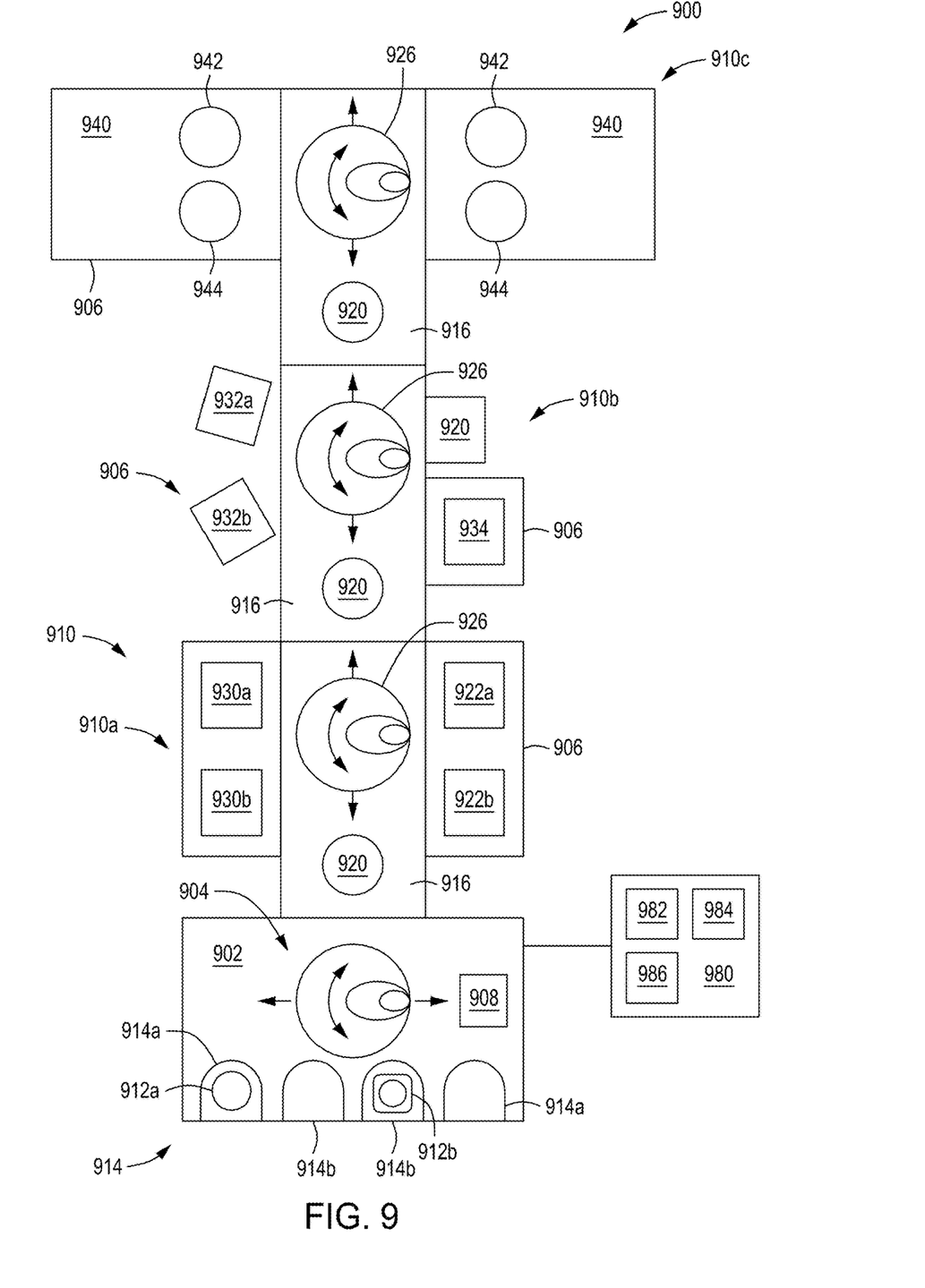
FIG. 9 depicts a schematic top view of a multi-chamber processing tool for bonding dies to a substrate in accordance with some embodiments of the present principles.

FIG. 9 depicts a schematic top view of a multi-chamber processing tool 900 (integrated hybrid bonding tool) for bonding dies to a substrate in accordance with at least some embodiments of the present principles. The methods and flows described above may be performed with the multi-chamber processing tool 900. The multi-chamber process tool 900 generally includes an equipment front end module (EFEM) 902 and a plurality of automation modules 910 that are serially coupled to the EFEM 902. The plurality of automation modules 910 are configured to shuttle one or more types of substrates 912 from the EFEM 902 through the multi-chamber process tool 900 and perform one or more processing steps to the one or more types of substrates 912 (e.g., component substrate with dies, a substrate to bond the dies to, etc.). Each of the plurality of automation modules 910 generally include a transfer chamber 916 and one or more process chambers 906 coupled to the transfer chamber 916 to perform the one or more processes. The plurality of automation modules 910 are coupled to each other via their respective transfer chamber 916 to provide modular expandability and customization of the multi-chamber process tool 900. As depicted in FIG. 9, the plurality of automation modules 910 comprise three automation modules, where a first automation module 910a is coupled to the EFEM 902, a second automation module 910b is coupled to the first automation module 910a, and a third automation module 910c is coupled to the second automation module 910b.

The EFEM 902 includes a plurality of load ports 914 for receiving one or more types of substrates 912. In some embodiments, the one or more types of substrates 912 include 200 mm wafers, 300 mm wafers, 450 mm wafers, tape frame substrates, carrier substrates with or without reconstituted dies, silicon substrates, glass substrates, or the like. In some embodiments, the plurality of load ports 914 include at least one of one or more first load ports 914a for receiving a first type of substrate 912a or one or more second load ports 914b for receiving a second type of substrate 912b. In some embodiments, the first type of substrates 912a have a different size than the second type of substrates 912b. In some embodiments, the second type of substrates 912b include tape frame substrates or carrier substrates. In some embodiments, the second type of substrates 912b include a plurality of dies disposed on a tape frame or carrier plate. In some embodiments, the second type of substrates 912b may hold different types and sizes of dies. As such, the one or more second load ports 914b may have different sizes or receiving surfaces configured to load the second type of substrates 912b having different sizes. In some embodiments, the plurality of load ports 914 are arranged along a common side of the EFEM 902. Although FIG. 9 depicts a pair of the first load ports 914a and a pair of the second load ports 914b, the EFEM 902 may include other combinations of load ports such as one first load port 914a and three second load ports 914b.

In some embodiments, the EFEM 902 includes a scanning station 908 having substrate ID readers for scanning the one or more types of substrates 912 for identifying information. In some embodiments, the substrate ID readers include a bar code reader or an optical character recognition (OCR) reader. The multi-chamber processing tool 900 is configured to use any identifying information from the one or more types of substrates 912 that are scanned to determine processing based on the identifying information, for example, different processes and/or placements for the first type of substrates 912a and the second type of substrates 912b. In some embodiments, the scanning station 908 may also be configured for rotational movement to align the first type of substrates 912a or the second type of substrates 912b. In some embodiments, the one or more of the plurality of automation modules 910 include a scanning station 908. An EFEM robot 904 is disposed in the EFEM 902 and configured to transport the first type of substrates 912a and the second type of substrates 912b between the plurality of load ports 914 to the scanning station 908. The EFEM robot 904 may include substrate end effectors for handling the first type of substrates 912a and second end effectors for handling the second type of substrates 912b. The EFEM robot 904 may rotate or rotate and move linearly.

The transfer chamber 916 includes a buffer 920 configured to hold one or more first type of substrates 912a. In some embodiments, the buffer 920 is configured to hold one or more of the first type of substrates 912a and one or more of the second type of substrates 912b. The transfer chamber 916 includes a transfer robot 926 configured to transfer the first type of substrates 912a and the second type of substrates 912b between the buffer 920, the one or more process chambers 906, and a buffer disposed in an adjacent automation module of the plurality of automation modules 910. For example, the transfer robot 926 in the first automation module 910a is configured to transfer the first type of substrates 912a and the second type of substrates 912b between the first automation module 910a and the buffer 920 in the second automation module 910b. In some embodiments, the buffer 920 is disposed within the interior volume of the transfer chamber 916, advantageously reducing the footprint of the overall tool. In addition, the buffer 920 can be open to the interior volume of the transfer chamber 916 for ease of access by the transfer robot 926.

The one or more process chambers 906 may include atmospheric chambers that are configured to operate under atmospheric pressure and vacuum chambers that are configured to operate under vacuum pressure. Examples of the atmospheric chambers may generally include wet clean chambers, radiation chambers, heating chambers, metrology chambers, bonding chambers, or the like. Examples of vacuum chambers may include plasma activation chambers. The types of atmospheric chambers discussed above may also be configured to operate under vacuum, if needed. The one or more process chambers 906 may be any process chambers or modules needed to perform a bonding process, a cleaning process, a radiation process, or the like. In some embodiments, the one or more process chambers 906 of each of the plurality of automation modules 910 include at least one of a wet clean chamber 922, a plasma activation chamber 930, a degas chamber 932, a radiation chamber 934, or a bonder chamber 940 such that the multi-chamber processing tool 900 includes at least one wet clean chamber 922, at least one plasma activation chamber 930, at least one degas chamber 932, at least one radiation chamber 934, and at least one bonder chamber 940. The one or more process chambers 906 may be arranged in any suitable location of the multi-chamber processing tool 900.

The wet clean chamber 922 is configured to perform a wet clean process to clean the one or more types of substrates 912 via a fluid, such as water. The wet clean chamber 922 may include a first wet clean chamber 922a for cleaning the first type of substrates 912a or a second wet clean chamber 922b for cleaning the second type of substrates 912b. The degas chamber 932 is configured to perform a degas process to remove moisture via, for example, a high temperature baking process. In some embodiments, the degas chamber 932 includes a first degas chamber 932a and a second degas chamber 932b. The plasma activation chamber 930 may be configured to perform an activation process on a substrate in preparation for hybrid bonding. The activation aids in increasing bonding strength between surfaces. In some embodiments, the plasma activation chamber 930 includes a first plasma activation chamber 930a and a second plasma activation chamber 930b. The radiation chamber 934 is configured to perform a radiation process to reduce adhesion between dies on a component substrate such as, for example, a tape frame substrate or a carrier substrate with reconstituted dies. For example, the radiation chamber 934 may be an ultraviolet radiation chamber configured to direct ultraviolet radiation at the component substrate or a heating chamber configured to heat the component substrate. The reduced adhesion between the dies and the component substrate facilitates easier removal of the dies 206 from the component substrate. The bonder chamber 940 is configured to transfer and bond at least a portion of the dies from a component substrate to the substrate. The bonder chamber 940 generally includes a first support 942 to support one of the first type of substrates 912a and a second support 944 to support one of the second type of substrates 912b.

In some embodiments, a last automation module of the plurality of automation module 910, for example the third automation module 910c of FIG. 9, includes one or more bonder chambers 940 (two shown in FIG. 9). In some embodiments, a first of the two bonder chambers is configured to remove and bond dies having a first size and a second of the two bonder chambers is configured to remove and bond dies having a second size. In some embodiments, any of the plurality of automation modules 910 include a metrology chamber 918 configured to take measurements of the one or more types of substrates. In FIG. 9, the metrology chamber 918 is shown as a part of the second automation module 910b coupled to the transfer chamber 916 of the second automation module 910b. However, the metrology chamber 918 may be coupled to any transfer chamber 916 or within the transfer chamber 916.

A controller 980 controls the operation of any of the multi-chamber processing tools described herein, including the multi-chamber processing tool 900. The controller 980 may use a direct control of the multi-chamber processing tool 900, or alternatively, by controlling the computers (or controllers) associated with the multi-chamber processing tool 900. In operation, the controller 980 enables data collection and feedback from the multi-chamber processing tool 900 to optimize performance of the multi-chamber processing tool 900 and to control the processing flow according to methods described herein. The controller 980 generally includes a central processing unit (CPU) 982, a memory 984, and a support circuit 986. The CPU 982 may be any form of a general-purpose computer processor that can be used in an industrial setting. The support circuit 986 is conventionally coupled to the CPU 982 and may comprise a cache, clock circuits, input/output subsystems, power supplies, and the like. Software routines, such as methods as described above may be stored in the memory 984 and, when executed by the CPU 982, transform the CPU 982 into a specific purpose computer (controller 980). The software routines may also be stored and/or executed by a second controller (not shown) that is located remotely from the multi-chamber processing tool 900.

The memory 984 is in the form of computer-readable storage media that contains instructions, when executed by the CPU 982, to facilitate the operation of the semiconductor processes and equipment. The instructions in the memory 984 are in the form of a program product such as a program that implements methods of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for bonding a die to a substrate, comprising:
performing a radiation process on a component substrate with a plurality of dies to weaken an adhesive bonding of the plurality of dies from a surface of the component substrate;
performing a degas process on the component substrate after the radiation process of the component substrate and prior to performing a plasma activation process on the component substrate;
performing the plasma activation process on the component substrate after the radiation process of the component substrate and prior to performing a first wet clean process on the component substrate;
performing the first wet clean process on the component substrate after the radiation process to clean at least one die bonding surface;
performing eject and pick processes after performing the first wet clean process to remove at least one of the plurality of dies from the component substrate for bonding to a substrate;
performing a plasma activation process on the substrate;
performing a second wet clean process after the plasma activation process on the substrate to clean a substrate bonding surface of the substrate; and
performing a hybrid bonding process to bond the at least one die bonding surface of the at least one of the plurality of dies to the substrate bonding surface of the substrate.

2. The method of claim 1, wherein the method is performed without hydration of the component substrate or the substrate.

3. The method of claim 2, wherein the degas process also includes moisture removal from the component substrate.

4. The method of claim 1, wherein the radiation process includes irradiating the component substrate with ultraviolet radiation.

5. The method of claim 1 performed in an integrated hybrid bonding tool.

6. The method of claim 1, wherein the component substrate is a tape frame substrate.

7. The method of claim 1, wherein the component substrate is a carrier substrate with reconstituted dies.

8. The method of claim 1, wherein the substrate is a silicon or glass-supported silicon substrate.

9. The method of claim 8, wherein the substrate has stacked dies from prior bonding processes.

10. A hybrid bonding tool for bonding dies to substrates, the hybrid bonding tool comprising:
at least one radiation chamber;
at least one wet clean chamber;
at least one plasma activation chamber;
at least one hybrid bonding chamber; and
a controller of the hybrid bonding tool configured to bond dies to substrates by causing a performance of:
a radiation process in the at least one radiation chamber on a component substrate with a plurality of dies to weaken an adhesive bonding of the plurality of dies from a surface of the component substrate;
a first wet clean process in the at least one wet clean chamber on the component substrate after the radiation process to clean at least one die bonding surface;
eject and pick processes in the at least one hybrid bonding chamber after performing the first wet clean process to remove at least one of the plurality of dies from the component substrate for bonding to a substrate;
a plasma activation process in the at least one plasma activation chamber on the substrate;
a second wet clean process in the at least one wet clean chamber after the plasma activation process on the substrate to clean a substrate bonding surface of the substrate; and
a hybrid bonding process in the at least one hybrid bonding chamber to bond the at least one die bonding surface of the at least one of the plurality of dies to the substrate bonding surface of the substrate.

11. The hybrid bonding tool of claim 10, the controller configured to bond dies to substrates by further causing a performance of:
a plasma activation process in the at least one plasma activation chamber on the component substrate after the radiation process of the component substrate and prior to performing the first wet clean process on the component substrate.

12. The hybrid bonding tool of claim 11, further comprising:
at least one degas chamber, wherein the controller is configured to bond dies to substrates by further causing a performance of:
a degas process in the at least one degas chamber on the component substrate after the radiation process of the component substrate and prior to performing the plasma activation process on the component substrate.

13. The hybrid bonding tool of claim 10, wherein the radiation process includes irradiating the component substrate with ultraviolet radiation.

14. A non-transitory, computer readable medium having instructions stored thereon that, when executed, cause a method for bonding a die to a wafer to be performed, the method comprising:
performing a radiation process on a component substrate with a plurality of dies to weaken an adhesive bonding of the plurality of dies from a surface of the component substrate;
performing a degas process on the component substrate after the radiation process of the component substrate and prior to performing a plasma activation process on the component substrate;
performing the plasma activation process on the component substrate after the radiation process of the component substrate and prior to performing a first wet clean process on the component substrate;
performing the first wet clean process on the component substrate after the radiation process to clean at least one die bonding surface;
performing eject and pick processes after performing the first wet clean process to remove at least one of the plurality of dies from the component substrate for bonding to a substrate;
performing a plasma activation process on the substrate;
performing a second wet clean process after the plasma activation process on the substrate to clean a substrate bonding surface of the substrate; and
performing a hybrid bonding process to bond the at least one die bonding surface of the at least one of the plurality of dies to the substrate bonding surface of the substrate.

15. The non-transitory, computer readable medium of claim 14, wherein the method is performed without hydration of the component substrate or the substrate.

16. The non-transitory, computer readable medium of claim 15, wherein the degas process also includes moisture removal from the component substrate.

17. The non-transitory, computer readable medium of claim 14, wherein the radiation process includes irradiating the component substrate with ultraviolet radiation.

18. The non-transitory, computer readable medium of claim 14, wherein the component substrate is a tape frame substrate.

19. The non-transitory, computer readable medium of claim 14, wherein the component substrate is a carrier substrate with reconstituted dies.

20. The non-transitory, computer readable medium of claim 14, wherein the substrate is a silicon or glass-supported silicon substrate with or without stacked dies from prior bonding processes.

* * * * *